United States Patent
Bittner et al.

(10) Patent No.: US 9,709,770 B2
(45) Date of Patent: Jul. 18, 2017

(54) MIRROR ARRANGEMENT FOR AN EUV PROJECTION EXPOSURE APPARATUS, METHOD FOR OPERATING THE SAME, AND EUV PROJECTION EXPOSURE APPARATUS

(71) Applicant: Carl Zeiss SMT GmbH, Oberkochen (DE)

(72) Inventors: Boris Bittner, Roth (DE); Norbert Wabra, Werneck (DE); Sonja Schneider, Oberkochen (DE); Ricarda Schoemer, Zusmarshausen (DE); Hendrik Wagner, Aalen (DE); Rumen Iliew, Oberkochen (DE); Walter Pauls, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 142 days.

(21) Appl. No.: 14/584,164

(22) Filed: Dec. 29, 2014

(65) Prior Publication Data

US 2015/0168674 A1 Jun. 18, 2015

Related U.S. Application Data

(63) Continuation of application No. PCT/EP2013/065000, filed on Jul. 16, 2013.
(Continued)

(30) Foreign Application Priority Data

Jul. 24, 2012 (DE) .................. 10 2012 212 898

(51) Int. Cl.
*G03F 7/20* (2006.01)
*G02B 7/18* (2006.01)
(Continued)

(52) U.S. Cl.
CPC ............ *G02B 7/1815* (2013.01); *B82Y 10/00* (2013.01); *G02B 5/0891* (2013.01); *G02B 7/008* (2013.01);
(Continued)

(58) Field of Classification Search
None
See application file for complete search history.

(56) References Cited

U.S. PATENT DOCUMENTS

| 6,864,957 B2 | 3/2005 | Van Elp et al. |
| 7,049,033 B2 * | 5/2006 | Stearns ................. B82Y 10/00 250/492.3 |

(Continued)

FOREIGN PATENT DOCUMENTS

| CN | 1456933 | 11/2003 |
| DE | 10 2011 085 358 B3 | 7/2012 |

(Continued)

OTHER PUBLICATIONS

Chinese Office Action, with translation thereof, for corresponding CN Appl No. 201380039384.1, dated Feb. 22, 2016.
(Continued)

*Primary Examiner* — Steven H Whitesell Gordon
(74) *Attorney, Agent, or Firm* — Fish & Richardson P.C.

(57) ABSTRACT

A mirror arrangement for an EUV projection exposure apparatus for microlithography comprises a plurality of mirrors each having a layer which is reflective in the EUV spectral range and to which EUV radiation can be applied, and having a main body. In this case, at least one mirror of the plurality of mirrors has at least one layer comprising a material having a negative coefficient of thermal expansion. Moreover, a method for operating the mirror arrangement and a projection exposure apparatus are described. At least one heat source is arranged, in order to locally apply heat in
(Continued)

Figure 1:
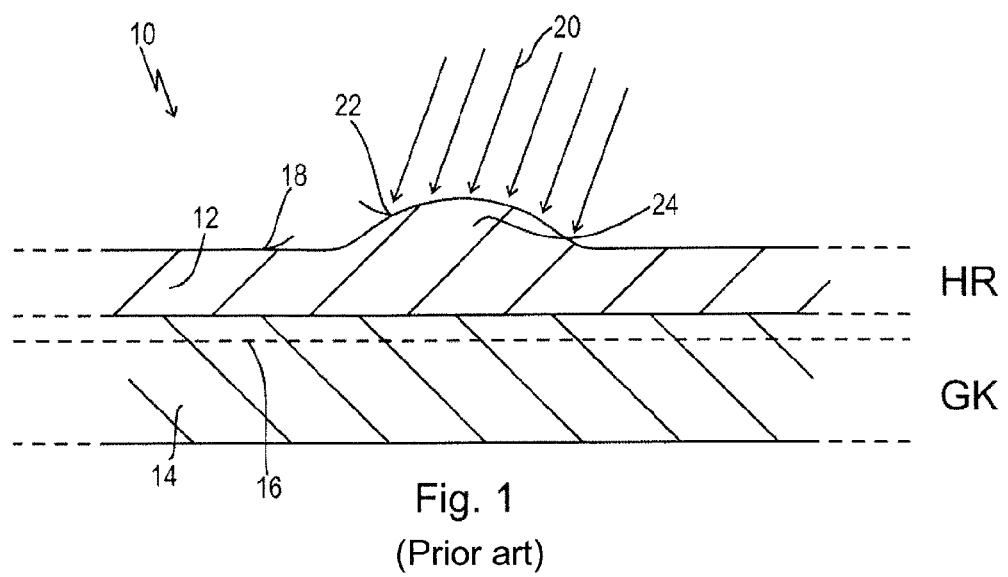

a targeted manner to the at least one layer having a negative coefficient of thermal expansion of the at least one mirror.

14 Claims, 9 Drawing Sheets

Related U.S. Application Data

(60) Provisional application No. 61/674,922, filed on Jul. 24, 2012.

(51) Int. Cl.
- *G21K 1/06* (2006.01)
- *G02B 5/08* (2006.01)
- *B82Y 10/00* (2011.01)
- *G02B 7/00* (2006.01)
- *G02B 17/06* (2006.01)
- *G02B 27/00* (2006.01)

(52) U.S. Cl.
CPC ..... *G02B 17/0657* (2013.01); *G02B 17/0663* (2013.01); *G02B 27/0025* (2013.01); *G03F 7/702* (2013.01); *G03F 7/706* (2013.01); *G03F 7/70216* (2013.01); *G03F 7/70266* (2013.01); *G03F 7/70891* (2013.01); *G03F 7/70958* (2013.01); *G21K 1/062* (2013.01); *G21K 2201/067* (2013.01)

(56) References Cited

U.S. PATENT DOCUMENTS

| 7,977,651 | B2 | 7/2011 | Mann et al. |
| 2005/0207001 | A1 | 9/2005 | Laufer et al. |
| 2007/0035814 | A1 | 2/2007 | Dinger et al. |
| 2008/0259439 | A1* | 10/2008 | Shiraishi ............... B82Y 10/00 359/360 |
| 2008/0266651 | A1 | 10/2008 | Murakami et al. |
| 2011/0080569 | A1 | 4/2011 | Eva et al. |
| 2012/0170012 | A1* | 7/2012 | Masaki ................ G02B 5/0816 355/67 |
| 2013/0107239 | A1 | 5/2013 | Clauss |

FOREIGN PATENT DOCUMENTS

| JP | 2004-012533 | 1/2004 |
| WO | WO 2008/034636 A2 | 3/2008 |
| WO | WO 2012/013746 | 2/2012 |
| WO | WO 2012/013748 A1 | 2/2012 |

OTHER PUBLICATIONS

International Search Report and Written Opinion for corresponding PCT Appl No. PCT/EP2013/065000, dated Dec. 4, 2013.
Michael J. Kidger, "Fundamental Optical Design", SPIE Press, Bellingham, Washington, USA, 2002, pp. 25-26.
German Examination Report, with translation thereof, for corresponding DE Appl No. 10 2012 212 898.0, dated Jan. 18, 2013.
Chinese Office Action, with English translation thereof for CN Appl. No. 201380039384.1, dated Oct. 17, 2016, 17 pages.
Chinese Office Action, with translation thereof for corresponding CN Appln. No. 2013800393841, dated Apr. 1, 2017.

* cited by examiner

MIRROR ARRANGEMENT FOR AN EUV PROJECTION EXPOSURE APPARATUS, METHOD FOR OPERATING THE SAME, AND EUV PROJECTION EXPOSURE APPARATUS

The present application is a continuation of, and claims benefit under 35 USC 120 to, international application PCT/EP2013/065000, filed Jul. 16, 2013, which claims benefit under 35 USC 119 of German patent application No. 10 2012 212 898.0, filed Jul. 24, 2012. International application PCT/EP2013/065000 also claims priority under 35 USC 119(e) to U.S. Provisional Application No. 61/674,922, filed Jul. 24, 2012. The entire disclosure of international application PCT/EP2013/065000 and German Application No. 10 2012 212 898.0 are incorporated by reference herein.

The invention relates to a mirror arrangement for an EUV projection exposure apparatus for microlithography, comprising a plurality of mirrors each having a layer which is reflective in the EUV spectral range and to which EUV radiation can be applied, and having a main body.

The invention furthermore relates to an EUV projection exposure apparatus for microlithography comprising a mirror arrangement of this type.

Finally, the invention relates to a method for operating a mirror arrangement of the type mentioned in the introduction.

A projection exposure apparatus for microlithography is generally used for producing finely structured electronic components. Via a projection exposure apparatus, electromagnetic radiation generated by a radiation source is directed onto a reticle provided with fine structures. The reticle is arranged in the object plane of a projection lens of the projection exposure apparatus, wherein the structures of the reticle are imaged onto a wafer via the projection lens, the wafer usually comprising a semiconductor material and being arranged in the image plane of the projection lens. In this case, the wafer is coated with a radiation-sensitive photoresist, which is exposed by the radiation in accordance with the structures of the reticle and is subsequently developed.

Owing to the increasing requirement for high integration of electronic components produced in this way, there are correspondingly stringent requirements for the miniaturization of the structures of the reticle and the resolution capability of the projection lens used in the projection exposure apparatus. It is known that the resolution capability of a projection lens increases as the wavelength of the used radiation decreases. Projection exposure apparatuses currently in use for volume production operate with electromagnetic radiation in the wavelength range of 193 nm or higher.

In order to be able to image even finer structures onto a wafer, a radiation of even shorter wavelength is correspondingly required.

The present invention accordingly proceeds from a projection exposure apparatus for microlithography which operates with radiation having an extremely short wavelength, more specifically with extreme ultraviolet radiation, abbreviated to EUV radiation, the wavelength of which is for example in the range of approximately 5 nm to approximately 20 nm, in particular approximately 6.7 nm or approximately 13.5 nm.

An EUV projection exposure apparatus is described in various embodiments for example in the document U.S. Pat. No. 7,977,651 B2.

Since the materials available for the production of refractive optical components, such as lens elements, are opaque to EUV radiation, EUV projection exposure apparatuses are constructed from mirrors.

In EUV projection exposure apparatuses a technical problem arises in that the mirrors of the projection exposure apparatus heat up greatly on account of the EUV radiation and the necessity for operating the apparatus in a vacuum. The heat input into the mirrors has the effect that the reflective layer, which is usually embodied as a highly reflective layer stack, and the underlying mirror main body arranged on that side of the reflective layer which faces away from the EUV radiation deform reversibly under irradiation with the EUV radiation during operation. The deformations of the mirror surfaces result in undesired imaging aberrations of the projection lens which adversely affect the quality of the imaging of the structures of the reticle onto the wafer.

Numerous cooling concepts for mirrors in EUV projection exposure apparatuses have therefore been proposed for solving the technical problem mentioned above, for example the introduction of cooling fingers and of cooling channels through which fluid flows into the mirrors. However, these cooling concepts entail problems. This is because the introduction of cooling fingers into the mirrors leads to parasitic deformations. The introduction of cooling channels through which a cooling liquid flows leads to vibrations of the mirror on account of the flow dynamics of the cooling liquid, and to a coupling of the mirrors to the environment of the mirrors, which can cause disturbances of the imaging behavior of the mirrors. A further problem of the introduction of cooling channels or cooling fingers into the mirrors is that the cooling channels or cooling fingers become "imprinted" through the reflective layer because between the cooling channels or cooling fingers there are regions that are not cooled to the same extent as the regions in direct proximity to the cooling channels or cooling fingers.

A further problem is that it is extremely difficult to deliberately cool a mirror in a locally delimited manner in order to obtain a locally delimited influence on the surface profile of the reflective layer without adjacent regions of the surface profile of the reflective layer likewise being affected by the cooling in an undesirable manner. Although a locally delimited cooling could be achieved with the abovementioned cooling fingers or cooling channels, this is accompanied by the problems described above, for example the introduction of parasitic deformations into the mirror.

A further aspect when operating a projection exposure apparatus consists in being able to influence the imaging behavior of the projection lens of the projection exposure apparatus in a targeted manner during operation, for example in order to eliminate imaging aberrations that occur during operation. In conventional projection lenses comprising at least in part refractive optical components, so-called manipulators are provided, in particular those which bring about a targeted active deformation of a lens element in order to influence the wavefront profile of the radiation via the active deformation of the lens element. In the case of refractive optical elements, such active deformations can be brought about by the introduction of mechanical forces at the circumference of the lens element. In the case of a lens element, the optical effects of the front side and rear side of the lens element largely compensate for one another. Mirrors, by contrast, are more sensitive since they have only one optically active side. As a result, deformable mirrors experience excessively large, poorly controllable parasitic deformations. Moreover, the highly reflective layers of mirrors can easily be damaged in the course of a mechanical deformation.

For EUV mirrors so-called thermal manipulators have previously been proposed, with which surface deformations of the mirror can be deliberately brought about by applying a heat profile to the reflective layer. It is thereby possible to set a desired surface profile (figure profile) of the mirror in order, for example, to compensate for an imaging aberration of the projection lens. However, such conventional thermal manipulators prove to be disadvantageous if an existing surface profile of the mirror is intended to be changed on a short time scale in order, for example, to adapt the imaging behavior of the projection lens in a short time to a changed operating mode, for example a different illumination setting of the projection exposure apparatus. Since the thermal relaxation time of the respective mirror is very long without a high level of cooling, it would be necessary, in order to enable the surface profile to be changed on a short time scale, for the previous surface profile to be "overwritten" by the entire mirror being greatly heated in a largely areal manner until the previous surface profile is leveled. The new surface profile can then subsequently be produced by further heat input into the mirror. These two conceptually separate steps ("overwriting" and "profile setting") can also be performed in one step. However, this procedure facilitates very high heating capacities in order to "overwrite" the existing surface profile. Such high heat inputs can lead to layer stresses through to damage and/or destruction of the reflective layer over the lifetime of the projection exposure apparatus and to uncontrollable mechanical deformations. The problem becomes all the more serious if the mirror is situated in an optical position in which it experiences a high irradiance as a result of the EUV radiation. Moreover, the mount-side thermal budget of the projection lens can be permanently disturbed as a result.

This problem could be avoided by realizing a cooling mechanism that acts locally, but this is possible to a sufficient extent only in very rare cases on account of constructional boundary conditions, as has already been described above.

Therefore, there is furthermore a need to be able to eliminate a spatially localized surface deformation (figure deformation) on a short time scale and/or to set a different spatially localized figure deformation without excessive heating.

Therefore, the invention is based on the object of developing a mirror arrangement of the type mentioned in the introduction to the effect of affording the possibility of being able to set the surface profile (figure) of at least one of the mirrors of the mirror arrangement with the shortest possible time delay, with reduced heat input in comparison with the previous solutions described above.

The invention furthermore aims to provide an EUV projection exposure apparatus for microlithography comprising such a mirror arrangement.

The invention is furthermore based on the object of specifying a method for operating the mirror arrangement.

According to the invention, the object on which the invention is based is achieved with regard to the mirror arrangement mentioned in the introduction by virtue of the fact that at least one mirror of the plurality of mirrors has at least one layer comprising a material having a negative coefficient of thermal expansion.

The mirror arrangement according to the invention for an EUV projection exposure apparatus for microlithography thus comprises at least one mirror having at least one layer having a negative coefficient of thermal expansion. A material having a negative coefficient of thermal expansion is one which does not expand as the temperature increases, but rather contracts. This makes it possible, for example, to reverse a figure deformation of the surface of the mirror in the form of a surface peak by heat being locally applied in a targeted manner to the layer having a negative coefficient of thermal expansion. A surface peak, which can arise for example as a result of the feed input of the EUV radiation, can thus be neutralized.

However, there is also the possibility, by locally applying heat in a targeted manner to the at least one layer having a negative coefficient of thermal expansion, of changing an existing surface profile of the reflective layer of the mirror in a desired manner, without the previous surface profile firstly having to be neutralized by the entire mirror being greatly heated for this purpose. Specifically, by applying heat locally in a targeted manner to the at least one layer having a negative coefficient of thermal expansion, firstly a surface peak can be neutralized and the "new" surface profile can be produced by subsequent heat input on a different region of the reflective layer. Since here it is not necessary to wait for the thermal relaxation of the mirror, in this way a thermal manipulator is provided which can operate firstly with lower heating capacity and secondly on a shorter time scale.

In the case of the mirror arrangement according to the invention, on account of the at least one mirror having at least one layer having a negative coefficient of thermal expansion, it is not necessary to provide a targeted local cooling, which is technically extremely difficult to realize, since all thermal manipulations can be realized by application of heat.

To this end, in a preferred configuration, the mirror arrangement comprises at least one heat source, in order to locally apply heat in a targeted manner to the at least one layer having a negative coefficient of thermal expansion of the at least one mirror.

Cooling for setting a desired surface profile of the reflective layer of the at least one mirror is advantageously not required. Cooling, for example areal, non-spatially resolved cooling, of the mirror, for example on that side of the mirror which faces away from the EUV radiation, may nevertheless be desirable in order to stabilize the long-term thermal budget of the projection lens.

It is to be understood that, within the scope of the present invention, the following preferred configurations are also applicable without the presence of the at least one heat source, i.e. the following preferred configurations are directly applicable with the inventive concept that at least one mirror of the plurality of mirrors has at least one layer comprising a material having a negative coefficient of thermal expansion.

The at least one layer having a negative coefficient of thermal expansion is arranged on that side of the reflective layer which faces away from the EUV radiation, and can be adjacent thereto directly or indirectly in the manner separated by one or more layers. The at least one layer having a negative coefficient of thermal expansion can be the main body itself, a partial layer of the main body or preferably a separate layer between the reflective layer and the main body.

In a preferred configuration, the at least one mirror has at least one further layer comprising a material having a positive coefficient of thermal expansion, which is separated from the at least one layer having a negative coefficient of thermal expansion by at least one thermally insulating layer.

In this case, it is advantageous that with one and the same mirror a thermal manipulator can be provided which can be used to produce both surface peaks and surface valleys in the surface of the reflective layer of the mirror by heat being applied to the at least one layer having a positive coefficient of thermal expansion and the at least one layer having a negative coefficient of thermal expansion independently of one another. The at least one thermally insulating layer provided prevents a heat transfer between the layers having a positive and a negative coefficient of thermal expansion, such that the thermal manipulator thus provided operates in a readily controllable manner. By way of example, the reflective layer itself or an additional layer between the reflective layer and the main body can serve as a layer having a positive coefficient of thermal expansion.

In a further preferred configuration, at least one further mirror of the plurality of mirrors has at least one layer comprising a material having a negative coefficient of thermal expansion.

In this configuration, therefore, at least two of the plurality of mirrors of the mirror arrangement each have a layer having a negative coefficient of thermal expansion, as a result of which, in the case where these two mirrors are used as a thermal manipulator, the targeted heat input is distributed between at least two mirrors, as a result of which the individual heat input into each individual mirror can be reduced.

In a further preferred configuration, at least one further mirror of the plurality of mirrors has at least one layer comprising a material having a positive coefficient of thermal expansion.

In this configuration, in conjunction with the at least one mirror having the at least one layer having a negative coefficient of thermal expansion a thermal manipulator is provided with which, in the case of corresponding targeted local application of heat to the at least one layer having a negative coefficient of thermal expansion and the at least one layer having a positive coefficient of thermal expansion, an overall resulting surface profile of the at least two mirrors can be set in order to obtain a desired influence on the wavefront of the EUV radiation. In this case, too, it is once again additionally advantageous that the heat input for operating the thermal manipulator is distributed between at least two mirrors, as a result of which the thermal loading of the individual mirrors is reduced.

In connection with the two configurations mentioned above, it is preferred if the at least one mirror and the at least one further mirror are arranged at positions in the beam path of the EUV radiation which are conjugate or approximately conjugate with regard to their optical effect.

This measure is particularly advantageous if the at least one further mirror has at least one layer having a positive coefficient of thermal expansion. This is because in this case the optical effect of a figure deformation of one mirror can be neutralized by a corresponding inverse figure deformation of the other mirror. The disadvantageous method described in the introduction, of greatly heating the entire mirror in order to neutralize an existing figure profile, is completely obviated as a result. Rather, it is merely necessary to locally apply heat in a targeted manner to the layer having a positive or negative coefficient of thermal expansion in order, for example, to neutralize a surface peak by a corresponding surface valley.

Two positions or planes are called conjugate with respect to one another in the sense mentioned above if they have the same paraxial subaperture ratio.

The paraxial subaperture ratio is given by $(r/(|h|+|r|))$ sgn h, where r denotes the paraxial marginal ray height, h denotes the paraxial chief ray height and the signum function sgn h denotes the sign of h, where sgn $0=1$ shall be agreed. A definition of the paraxial marginal ray and paraxial chief ray is given in "Fundamental Optical Design" by Michael J. Kidger, SPIE PRESS, Bellingham, Wash., USA, which is incorporated by reference herein. With regard to the paraxial subaperture ratio, reference is furthermore made to WO 2008/034636 A2, page 41 et seq., which is likewise incorporated by reference herein.

Therefore, positions or planes in the beam path are approximately conjugate if the paraxial subaperture ratio at these positions or planes is approximately identical in terms of absolute value, deviating from one another preferably by not more than 0.3, with further preference by not more than 0.2, with further preference by not more than 0.1.

If the mirror arrangement comprises at least two mirrors each having at least one layer having a negative or positive coefficient of thermal expansion, preferably at least one further heat source is present, in order to locally apply heat in a targeted manner to the at least one layer having a positive or negative coefficient of thermal expansion of the at least one further mirror.

The same preferably holds true if the at least one mirror comprises both at least one layer having a positive coefficient of thermal expansion and at least one layer having a negative coefficient of thermal expansion. In this case, preferably at least one further heat source is present, in order to locally apply heat in a targeted manner to the at least one layer having a positive coefficient of thermal expansion of the at least one mirror.

Preferably, the at least one heat source and/or the at least one further heat source are/is designed to apply a positionally variable heat distribution to the at least one layer having a negative coefficient of thermal expansion and/or the at least one further layer having a positive coefficient of thermal expansion.

In this case, it is advantageous that a desired total surface profile of the reflective layer of the at least one mirror and/or of the at least one further mirror can be set by positionally variable heat input all at once on a short time scale.

Preferably, the at least one heat source and/or the at least one further heat source are/is an IR radiation source.

An infrared (IR) radiation source has the advantage of a contactless heat input into the corresponding mirror, as a result of which no parasitic forces as a result of mechanical linking, as in the case of heating wires, for example, can occur. IR pixel diodes are currently available which furthermore enable a targeted local, virtually punctiform introduction of the heat onto the layers having a positive and/or negative coefficient of thermal expansion. The infrared (IR) radiation source(s) can additionally be provided with a suitable attachment optical unit for the purpose of beam shaping. The wavelength of the thermal radiation can be in the range of approximately 500 nm to approximately 1200 nm.

In a further preferred configuration, the at least one heat source and/or the at least one further heat source apply(-ies) heat to the at least one layer having a negative coefficient of thermal expansion and/or the at least one layer having a positive coefficient of thermal expansion through the reflective layer.

Furthermore, the at least one heat source and/or the at least one further heat source apply(-ies) heat to the at least one layer having a negative coefficient of thermal expansion and/or the at least one layer having a positive coefficient of thermal expansion preferably from the side of the main body or from the rear side of the main body.

It is particularly preferred in practice if heat is applied to the at least one layer having a positive coefficient of thermal expansion through the reflective layer, while heat is applied to the at least one layer having a negative coefficient of thermal expansion from the side of the main body or from the rear side of the main body.

Separation of the application of heat to the at least one layer having a positive coefficient of thermal expansion from the application of heat to the at least one layer having a negative coefficient of thermal expansion has the advantage that the thermal manipulator thus provided operates in a defined manner and controllably because a mutual influencing of the heat inputs does not occur or is at least reduced.

In a further preferred configuration, at least one thermally insulating layer is present between the at least one layer having a negative coefficient of thermal expansion and the main body.

Such a thermally insulating layer can consist of quartz, for example. The material of the insulating layer should be selected such that it is transmissive to IR radiation, particularly if heat is intended to be applied to the at least one layer having a negative coefficient of thermal expansion through the main body.

In this case, it is furthermore preferred if a layer having high thermal conductivity is present between the thermally insulating layer and the main body.

A layer having high thermal conductivity between the thermally insulating layer and the main body, which layer can be formed from copper or nickel, for example, has the task of introducing the residual heat that remained in the mirror into the main body as uniformly as possible. The thickness of the layer having high thermal conductivity should be adapted to the thickness of the at least one layer having a negative coefficient of thermal expansion.

The main body of the at least one mirror or of the at least one further mirror is preferably produced from a material that is transparent to IR radiation and has very low thermal expansion, for example from the material ULE® from the manufacturer Corning, if the main body is not itself the at least one layer having a negative coefficient of thermal expansion or does not at least comprise the layer.

The material having a negative coefficient of thermal expansion is preferably selected from the group consisting of $ZrMo_2O_8$, $ZrW_2O_8$, $HfMo_2O_8$, $Zr_2(MoO_4)_3$, $Zr_2(WO_4)_3$, $Hf_2(MoO_4)_3$, $ScF_3$, $ZnC_2N_2$, $ZnF_2$, $Y_2W_3O_{12}$, $BiNiO_3$ and from mixtures of the abovementioned materials.

The abovementioned materials are distinguished by a high negative coefficient of thermal expansion. In selecting the materials having a negative coefficient of thermal expansion it should generally be taken into consideration that precise knowledge of the coefficient of thermal expansion in the temperature range used is available, the material is isotropic, since otherwise stresses and the risk of microcracks occur, it is possible for production to be effected as simply as possible, a negative coefficient of thermal expansion that is as high as possible is present, no phase transitions occur at relatively low pressures, and knowledge is available as to whether the material used contracts isotropically or anisotropically.

The material having a positive coefficient of thermal expansion as mentioned in connection with some configurations above is preferably selected from the group consisting of Zr, Y, Nb, Mo, Si, Ge, Ru, $RuO_2$, RuSi, Ni and from mixtures of the abovementioned materials.

Although it should be taken into account that the reflective layer of the at least one mirror also has a positive coefficient of thermal expansion, and is therefore suitable in principle for the targeted application of the heat in the sense of a thermal manipulator, in the case where an additional layer having a positive coefficient of thermal expansion is provided in the at least one mirror or the at least one further mirror, the abovementioned materials are preferred.

The reflective layer of the mirrors of the mirror arrangement is preferably a layer stack composed of molybdenum/silicon.

An EUV projection exposure apparatus for microlithography according to the invention comprises a mirror arrangement according to the invention.

With regard to the method for operating a mirror arrangement of an EUV projection exposure apparatus for microlithography as mentioned in the introduction, wherein the mirror arrangement comprises a plurality of mirrors each having a layer which is reflective in the EUV spectral range and to which EUV rays can be applied, and having a main body arranged on that side of the reflective layer which faces away from the EUV radiation, the object on which the invention is based is achieved by virtue of the fact that at least one mirror of the plurality of mirrors is provided with at least one layer comprising a material having a negative coefficient of thermal expansion, and in that heat is locally applied in a targeted manner to the at least one layer having a negative coefficient of thermal expansion in order to set a surface profile of the reflective layer of the at least one mirror in order to set a wavefront profile of the EUV radiation reflected at the plurality of mirrors.

The invention thus provides a thermal manipulator having at least one mirror having at least one layer having a negative coefficient of thermal expansion. The advantages resulting therefrom have already been mentioned above.

Preferably, the surface profile of the reflective layer is set in order to compensate for an imaging aberration, in order to counteract a deformation of the surface that is caused by the EUV radiation, and/or in order to vary the wavefront of the projection exposure apparatus.

Preferably, at least one further mirror of the plurality of mirrors is provided with at least one layer comprising a material having a negative coefficient of thermal expansion, wherein heat is locally applied in a targeted manner to the layer having a negative coefficient of thermal expansion of the at least one further mirror in order to set a surface profile of the reflective layer of the further mirror in order to set the wavefront profile of the projection exposure apparatus together with the surface profile of the reflective layer of the at least one mirror.

With further preference, the at least one mirror is provided with at least one further layer comprising a material having a positive coefficient of thermal expansion, and the at least one further layer is separated from the at least one layer having a negative coefficient of thermal expansion by at least one thermally insulating layer, wherein heat is likewise locally applied in a targeted manner to the at least one further layer in order to set the surface profile of the reflective layer.

Additionally or alternatively, at least one further mirror of the plurality of mirrors is preferably provided with at least one layer comprising a material having a positive coefficient of thermal expansion, wherein heat is locally applied in a targeted manner to the layer having a positive coefficient of thermal expansion of the at least one further mirror in order to set a surface profile of the reflective layer of the further mirror in order to set the wavefront profile of the EUV radiation reflected at the plurality of mirrors together with the surface profile of the reflective layer of the at least one mirror.

In connection with the two configurations mentioned above, preferably heat is locally applied in a targeted manner to the at least one layer having a positive coefficient of thermal expansion in order to compensate for a surface valley of the surface profile of the reflective layer, and/or preferably heat is locally applied in a targeted manner to the at least one layer having a negative coefficient of thermal expansion in order to compensate for a surface peak of the surface profile of the reflective layer.

With further preference, a positionally variable heat distribution is applied to the at least one layer having a negative coefficient of thermal expansion and/or the at least one layer having a positive coefficient of thermal expansion.

As already mentioned above, heat can be applied to the at least one layer having a negative coefficient of thermal expansion through the reflective layer, or preferably from the side of the main body, in particular through the latter.

Heat is applied to the at least one layer having a positive coefficient of thermal expansion preferably through the reflective layer, while heat is applied to the at least one layer having a negative coefficient of thermal expansion from the side of the main body, or through the latter.

This division of the application of heat is particularly advantageous if the reflective layer itself is used as a layer having a positive coefficient of thermal expansion in the sense of the thermal manipulator.

Further advantages and features are evident from the following description and the accompanying drawing.

It goes without saying that the features mentioned above and those yet to be explained below can be used not only in the combination respectively indicated, but also in other combinations or by themselves, without departing from the scope of the present invention.

Figure 2:
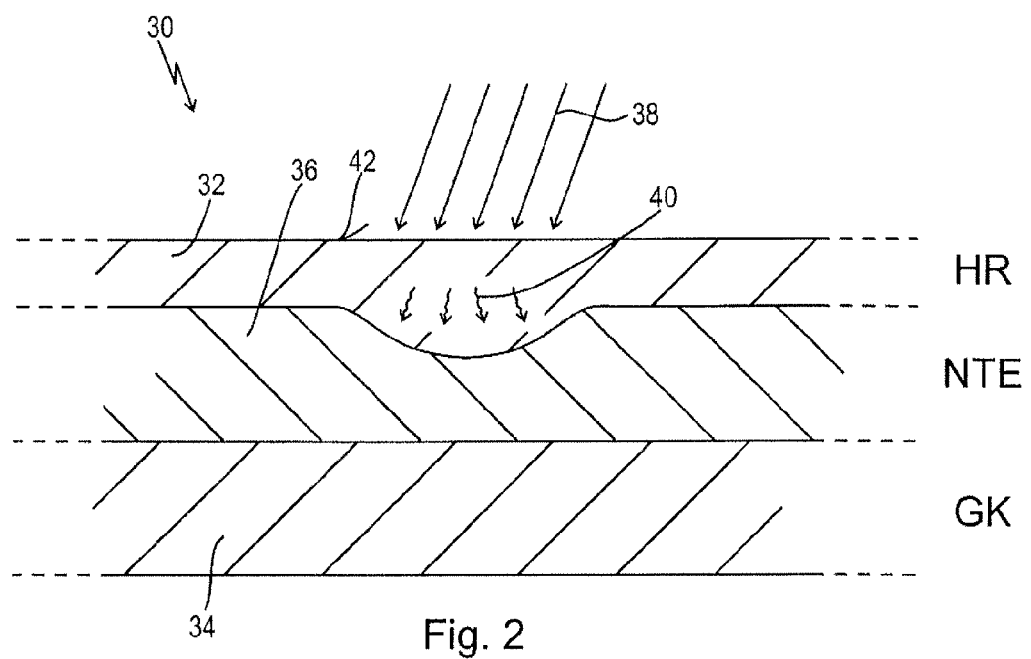
Figure 3:
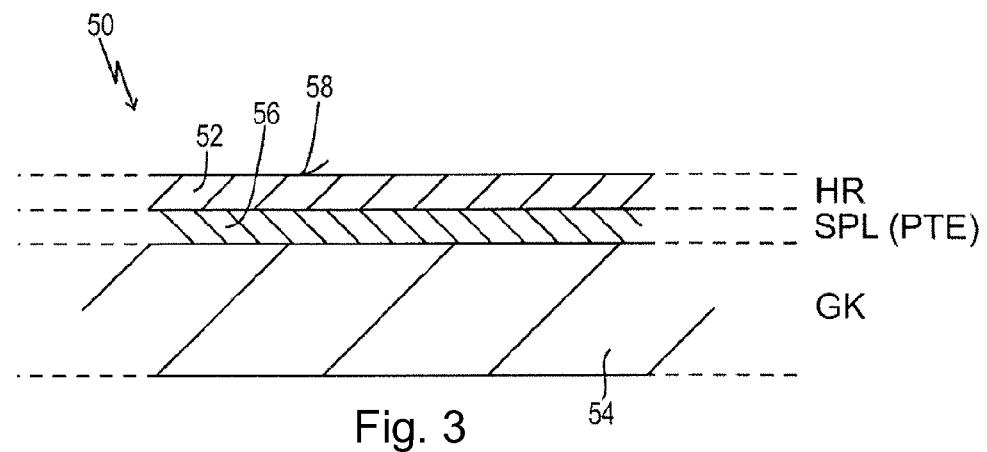
Figure 4A:
Figure 4B:
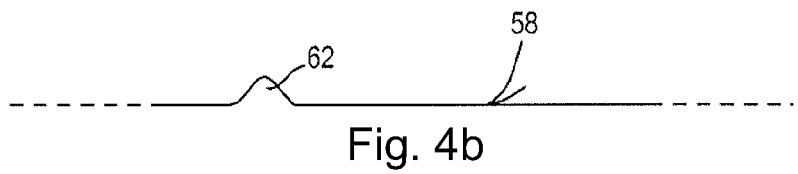
Figure 4C:
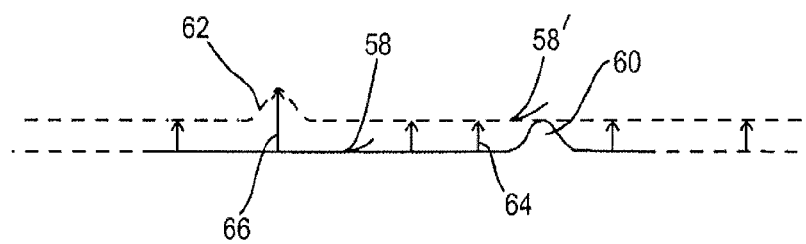
Figure 5:
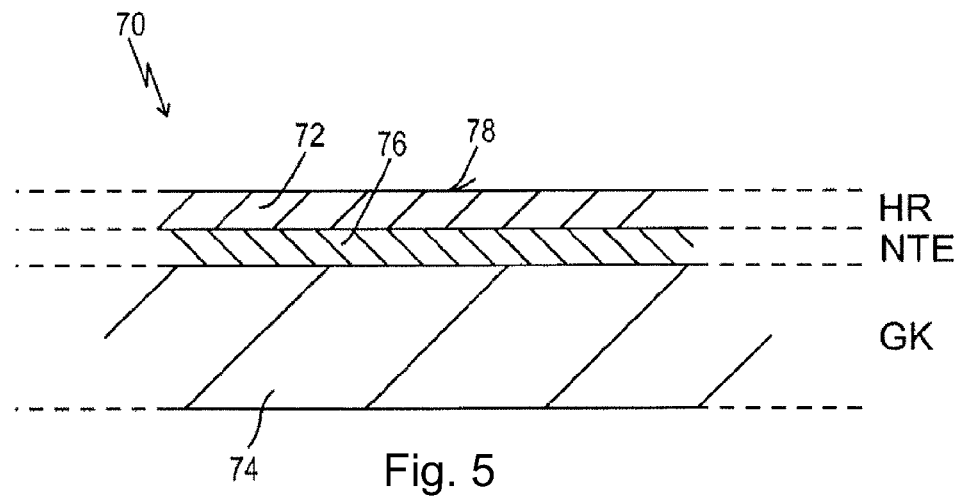
Figure 6A:
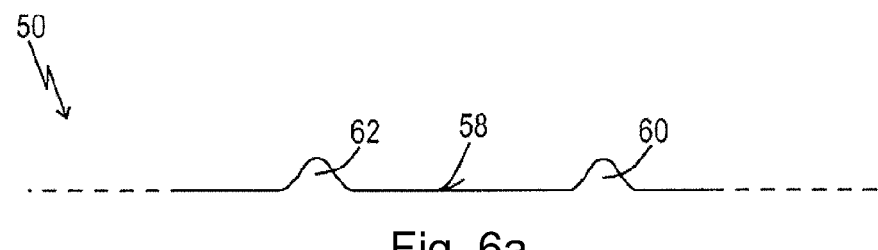
Figure 6B:
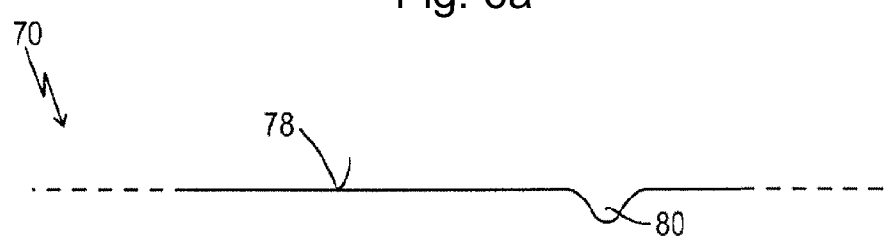
Figure 6C:
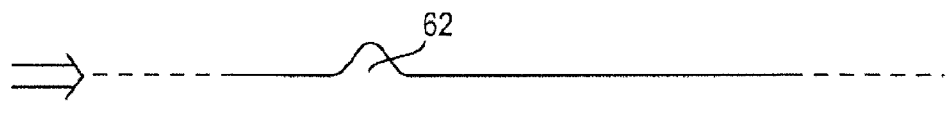
Figure 7:
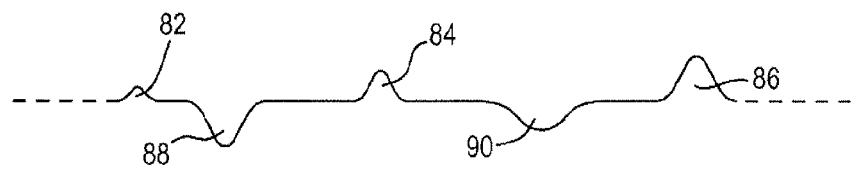
Figure 8A:
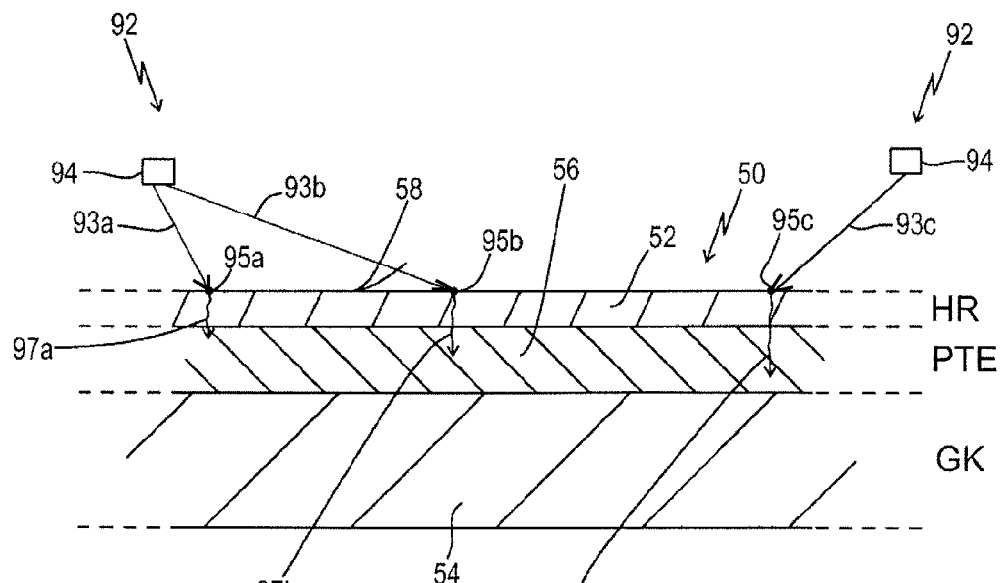
Figure 8B:
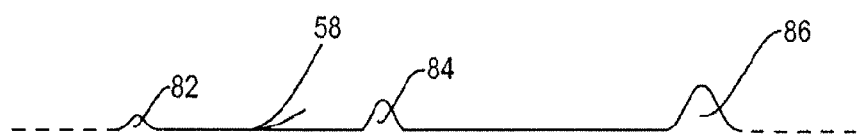
Figure 8C:
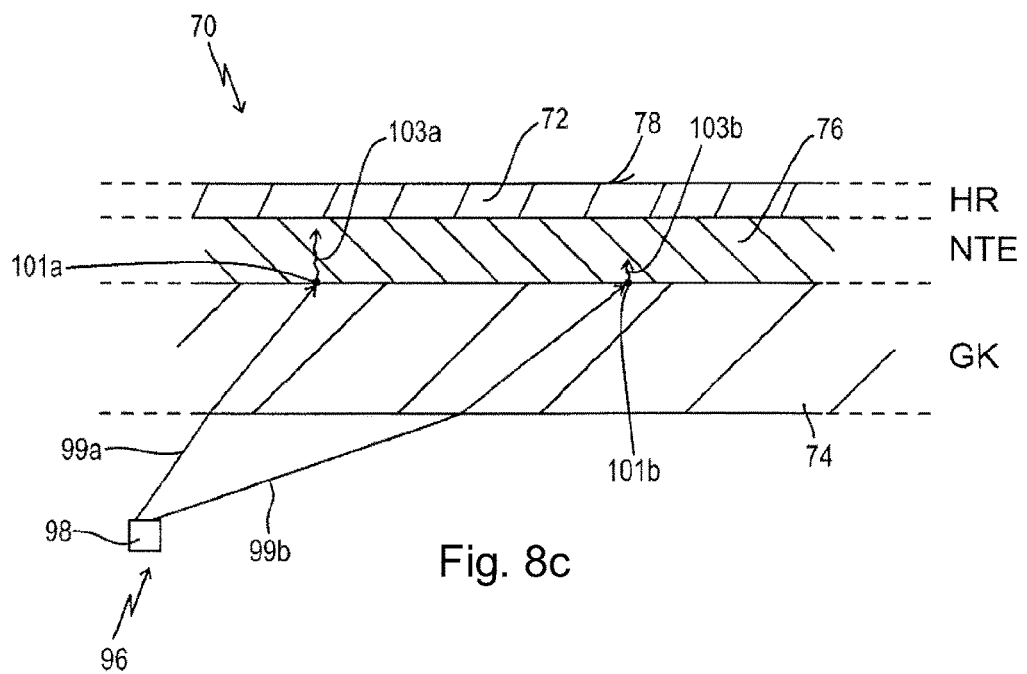
Figure 8D:
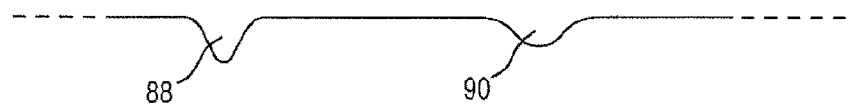
Figure 9:
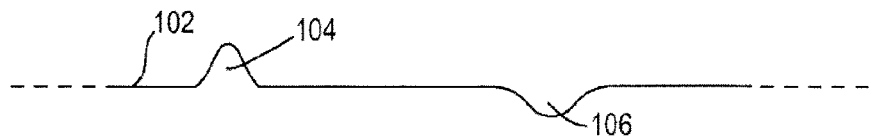
Figure 10:
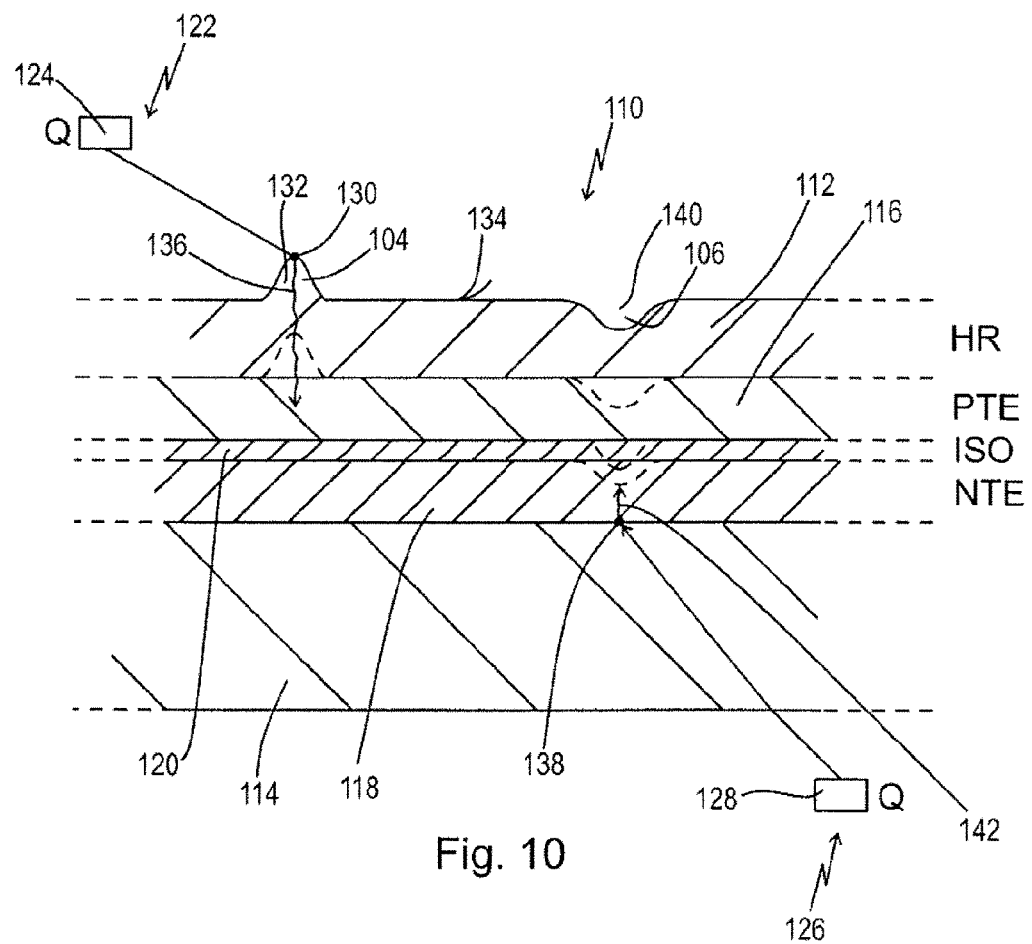
Figure 11:
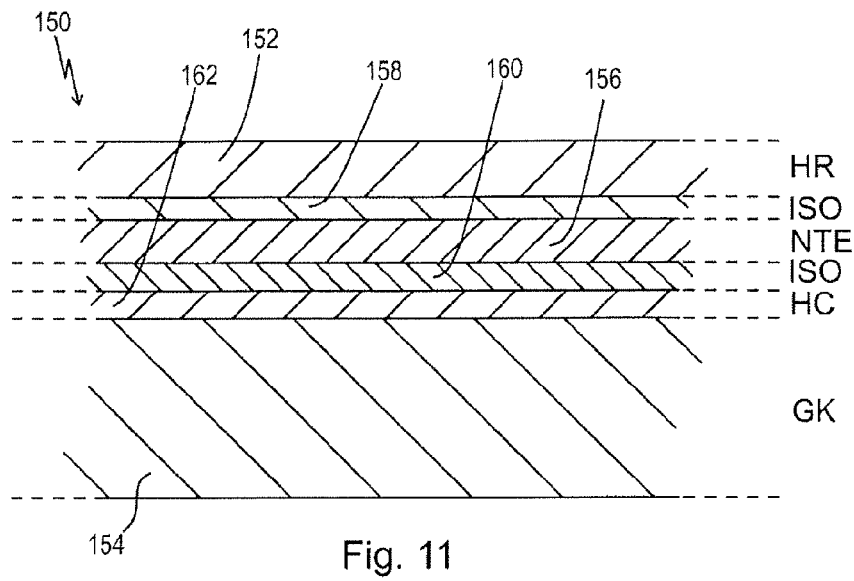
Figure 12:
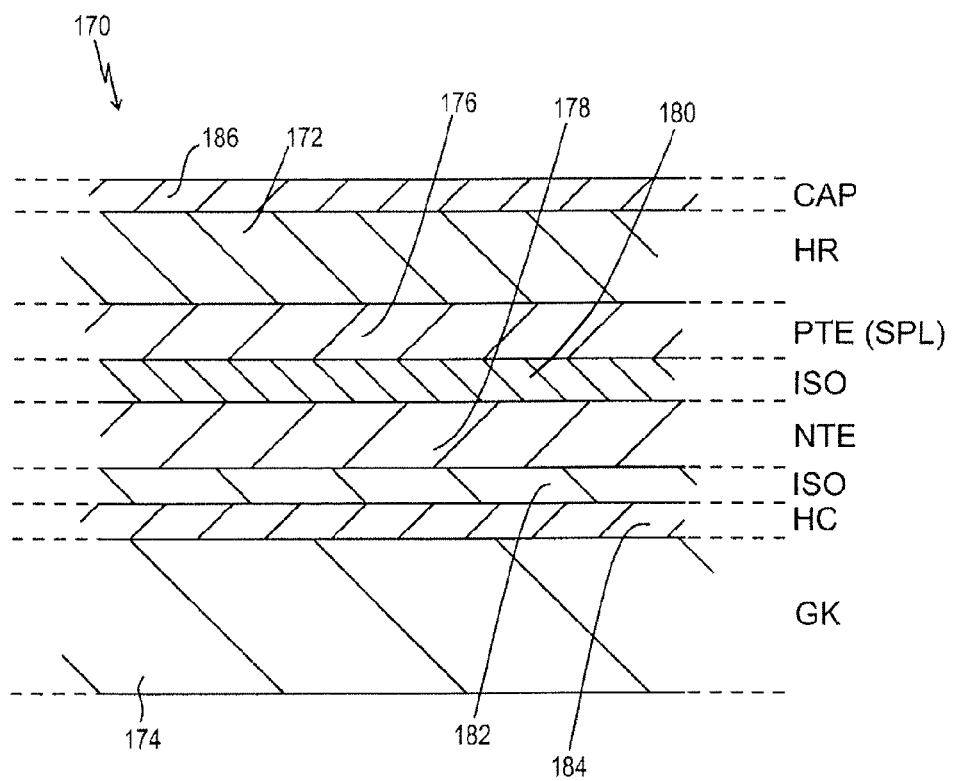
Figure 13:
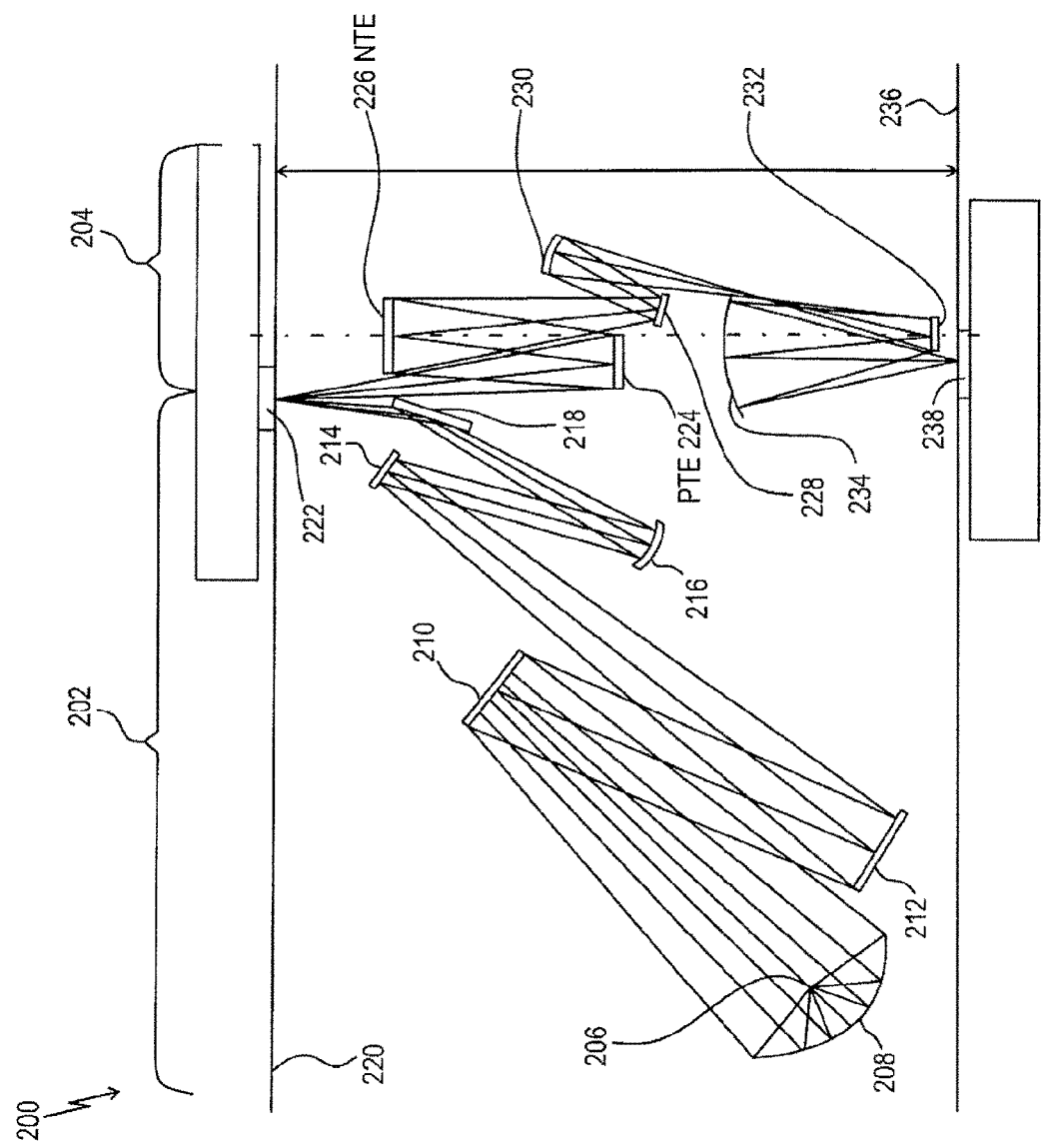
Figure 14:
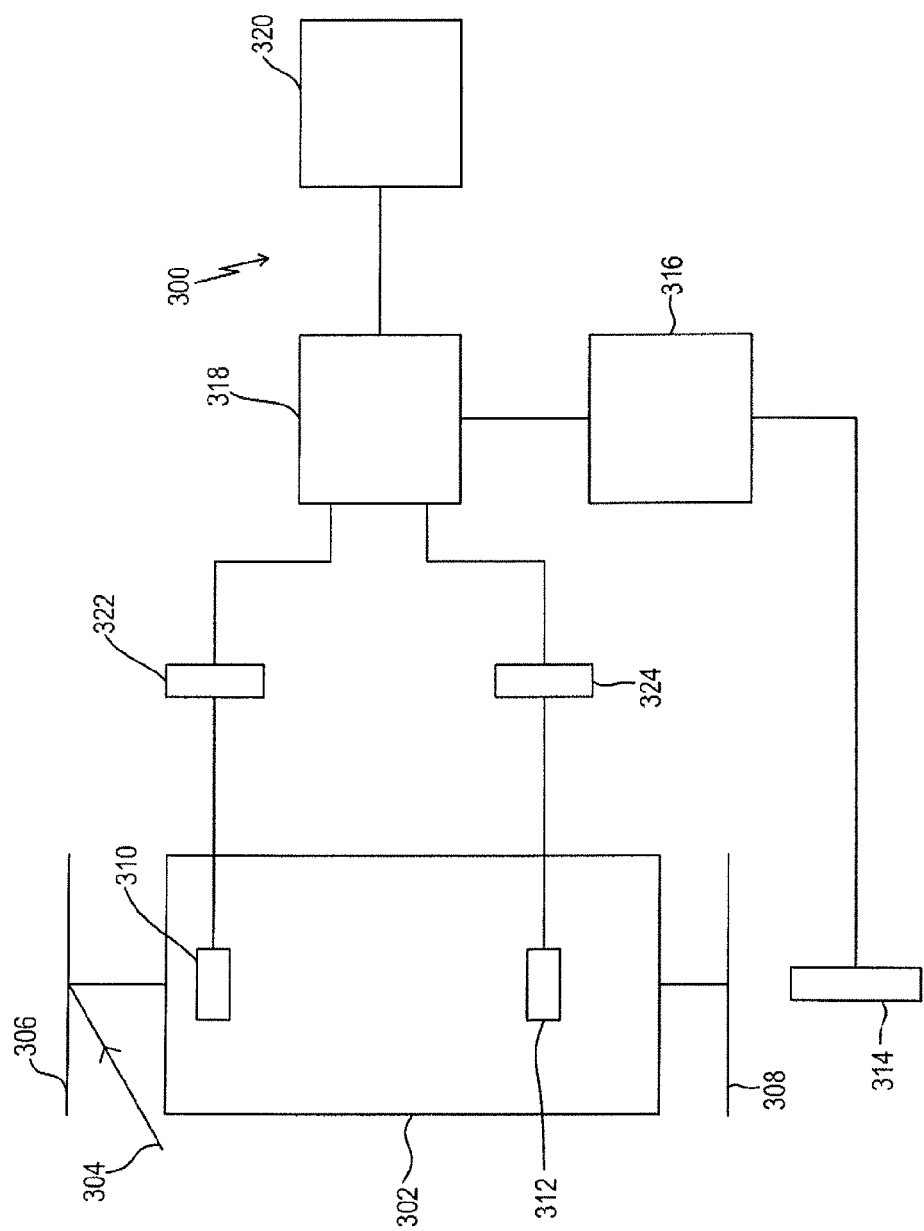

Exemplary embodiments of the invention are illustrated in the drawing and are described in greater detail hereinafter with reference thereto. In the figures:

FIG. 1 schematically shows an excerpt from a mirror in accordance with the prior art in section, EUV radiation being applied thereto;

FIG. 2 schematically shows an excerpt from a mirror in section, to which EUV radiation is applied, wherein the mirror has a layer having a negative coefficient of thermal expansion;

FIG. 3 schematically shows an excerpt from a further mirror in section;

FIGS. 4a) to 4c) show a surface of the mirror in FIG. 3, wherein the surface in FIG. 4a) has a surface deformation which is intended to be changed into a surface deformation in accordance with FIG. 4b) and FIG. 4c) shows a conventional method as to how the surface deformation in accordance with FIG. 4b) is produced from the surface deformation in accordance with FIG. 4a);

FIG. 5 schematically shows an excerpt from a mirror in section which has a layer having a negative coefficient of thermal expansion;

FIGS. 6a) to 6c) show an alternative method with respect to FIGS. 4a) to c) in order to obtain the same optical effect via a thermal manipulator having at least one mirror in accordance with FIG. 5, in order to produce the optical effect in accordance with the surface deformation in accordance with FIG. 4b) proceeding from the optical effect of the surface deformation in FIG. 4a), wherein FIGS. 6a) and 6b) shows two surface profiles having surface deformations whose resulting optical effect of the surface deformation is shown in FIG. 6c);

FIG. 7 schematically shows a resulting surface profile of a mirror arrangement for obtaining a desired optical effect on the wavefront of EUV radiation;

FIGS. 8a) to 8d) show a basic schematic diagram of how the optical effect on the wavefront profile in accordance with FIG. 7 can be achieved by a mirror arrangement comprising two mirrors, wherein FIG. 8a) schematically shows an excerpt from a first mirror in section having a layer having a positive coefficient of thermal expansion, FIG. 8b) shows a surface of the mirror in FIG. 8a) after targeted local application to the layer having a positive coefficient of thermal expansion, FIG. 8c) schematically shows an excerpt from a further mirror in section having a layer having a negative coefficient of thermal expansion, FIG. 8d) shows a surface of the mirror in FIG. 8c) after targeted local application to the layer having a negative coefficient of thermal expansion;

FIG. 9 schematically shows a surface profile of a mirror for obtaining a desired optical effect on the wavefront of EUV radiation;

FIG. 10 schematically shows an excerpt from a mirror in section which has both a layer having a positive coefficient of thermal expansion and a layer having a negative coefficient of thermal expansion, wherein the surface profile in accordance with FIG. 9 is set by targeted local application to the layer having a positive coefficient of thermal expansion and the layer having a negative coefficient of thermal expansion;

FIG. 11 schematically shows an excerpt from a mirror in section having a layer construction in accordance with a first exemplary embodiment;

FIG. 12 schematically shows an excerpt from a mirror in section having a layer construction in accordance with a further exemplary embodiment;

FIG. 13 shows an EUV projection exposure apparatus containing a mirror arrangement comprising a mirror pair having a mirror having a layer having a positive coefficient of thermal expansion and a mirror having a layer having a negative coefficient of thermal expansion; and FIG. 14 shows a basic illustration of a control system used for driving heat sources in a targeted manner in order to locally apply heat to mirrors of a projection lens which have at least one NTE or PTE layer, in order to set a wavefront profile of the projection lens.

Referring to FIGS. 1 to 13, the principles of the present invention are described in greater detail below. Insofar as the mirrors are shown as plane mirrors in the figures, it is understood that the drawing is merely schematic and the invention can, of course, also be applied to mirrors having concave curvature and having convex curvature. Furthermore, it should be noted that layer thicknesses shown in the figures are not true to scale either on their own or in relation to one another.

FIG. 1 illustrates a mirror 10 for a projection exposure apparatus for microlithography according to the prior art. The mirror 10 has a reflective layer (HR) 12 and a main body (GK) 14. Further layers are usually present in the main body 14 and the reflective layer 12, the further layers being symbolized here by an interrupted line 16 for reasons of simplification.

The reflective (HR) layer 12 is, for example, a molybdenum-silicon layer system having a topmost protection layer (not illustrated) composed of ruthenium (Ru) or rhodium (Rh), for example. The main body 14 is produced from a material having no or extremely low thermal expansion, for example a ULE (ultra low expansion), glass ceramic such as is offered by the manufacturer Corning.

The reflective layer 12 has a surface 18 to which EUV radiation 20 is applied during the operation of the mirror 10. The main body is thus situated on that side of the reflective layer 12 which faces away from the EUV radiation. The EUV radiation 20 can be applied to the entire surface 18 or, as shown in FIG. 1, only a section 22 of the surface 18.

The EUV radiation 20 is reflected for the most part at the surface 18 of the reflective layer 12, but part of the EUV radiation is absorbed by the reflective layer 12, as a result of which the reflective layer 12 heats up. The heating of the reflective layer 12 has the effect that the reflective layer 12 expands in the region where EUV radiation is applied to it, as a result of which the surface 18 of the reflective layer 12 deforms, as is illustrated by a surface peak 24 in FIG. 1. Such an undesirable surface deformation of the surface 18 of the reflective layer 12 is a consequence of the fact that the layer construction of the mirror 10 only contains materials having a positive coefficient of thermal expansion, which also include the material of the reflective layer 12.

By contrast, FIG. 2 shows a mirror 30 having a reflective (HR) layer 32, a main body (GK) 34 and, between the reflective layer 32 and the main body 34, a layer 36 comprising a material having a negative coefficient of thermal expansion (NTE, negative thermal expansion). One such material is $ZrW_2O_8$, for example. Further materials having a negative coefficient of thermal expansion will be mentioned later. A negative coefficient of thermal expansion means that the material does not expand in the event of a temperature increase, but rather, on the contrary, contracts. Conversely, a material having a negative coefficient of thermal expansion expands if heat is withdrawn from the material or if the temperature is decreased.

The layer 36 could also form the main body 34 itself or a part thereof, whereas it is embodied as a separate layer in the exemplary embodiment shown.

If EUV radiation 38 is applied to the mirror 30 during operation, the heat absorption of the reflective layer 32 has the effect that the heat, as is indicated by arrows 40, propagates to the layer 36 having a negative coefficient of thermal expansion, the layer 36 accordingly absorbs this heat and contracts. The contraction of the layer 36 compensates for the expansion of the reflective layer 32 precisely such that a surface 42 of the reflective layer 32 is not deformed. In order to achieve this effect, the thickness of the layer 36 and the material of the layer 36 should be adapted to the thickness and the material of the layer 32 and to the thermal expansion of the main body 34.

Layers of a mirror which comprise a material having a negative coefficient of thermal expansion are designated hereinafter as NTE layers for short. An NTE layer can be used in a mirror not only for avoiding a deformation of the surface of the reflective layer, rather an NTE layer can in particular also be used for bringing about a surface deformation in the surface of the reflective layer in a targeted manner, as is described below, with the result that a thermal manipulator is provided.

FIG. 3 firstly shows a mirror 50 having a reflective (HR) layer 52, a main body 54 and a layer 56 comprising a material having a positive coefficient of thermal expansion (PTE, positive temperature expansion, positive thermal expansion).

Layers having a positive coefficient of thermal expansion are designated hereinafter as PTE layers.

In the exemplary embodiment shown, the PTE layer 56 is a so-called surface protection layer (SPL), such as is usually used in EUV mirrors in order, for example, to protect the main body 54 against aging as a result of EUV radiation. The HR layer too, is generally a PTE layer.

FIG. 4a) depicts a surface 58 of the reflective layer 52 of the mirror 50 by itself in section. As a result of heat being locally applied to the mirror 50 in a targeted manner, the surface 58 has a surface or figure deformation 60 which is spatially localized. In the case where the surface deformation 60 was set in a targeted manner by application of heat to the mirror 50, this may be caused, for example, by the fact that the surface deformation 60 is intended to result in a specific optical effect on the wavefront of the EUV radiation, in order, for example, to compensate for an imaging aberration appearing in the EUV projection exposure apparatus. The surface deformation 60 can therefore be brought about by heat being locally applied to the mirror 50 in a targeted manner. Since the mirror 50 only comprises materials having a positive coefficient of thermal expansion, the surface deformation 60 is accordingly a surface peak.

It may then be desirable, for example in the event of a change in the operating mode of the EUV projection exposure apparatus, to eliminate the surface deformation 60 and in return to produce a different surface deformation 62 elsewhere on the surface 58. The surface deformation 62 is in turn a surface peak.

In the case of a mirror such as the mirror 50 which only comprises PTE layers, it is necessary in conventional methods, as is shown in FIG. 4c), firstly to apply heat to the entire mirror 50 until the surface 58 is brought by thermal expansion to a surface level 58' at which the surface deformation 60 is "overwritten". The raising of the level of the surface 58 to the surface level 58' is indicated by arrows 64.

In order to obtain the surface deformation 62 in accordance with FIG. 4b), heat is locally applied in a targeted manner to the mirror 50 proceeding from the surface level 58', in order to form the surface deformation 62 at the surface level 58' now set, as is indicated by an arrow 66. However, this procedure has the considerable disadvantage that the mirror 50 is loaded overall with a very high heat input that can lead to layer stresses through to the destruction of the reflective layer 52. Moreover, the additional heat input disturbs the thermal budget of the projection exposure apparatus, which results in a change or impairment of the wavefronts and can thus lead to a reduction of the yield during production. Furthermore, if the mirror 50 is arranged in a position of an EUV projection exposure apparatus in which it is already subjected to a high irradiance anyway as a result of the EUV radiation, this problem becomes even more serious.

On the other hand, consideration could be given to firstly eliminating the surface deformation 60 before the surface deformation 62 is introduced. Owing to the very slow thermal relaxation, however, the mirror 50 would have to be locally cooled in a targeted manner at the position of the surface deformation 60, but this cannot be realized without additional disadvantages in practice, as was discussed in the introductory part of the description.

A description will now be given below of how it is possible to set the surface profile of the surface 58 with the surface deformation 62 proceeding from the surface profile of the surface 58 with the surface deformation 60 on a short time scale, without excessive heat input and without active cooling.

For this purpose, according to the invention at least one mirror having at least one NTE layer is provided in the mirror arrangement of an EUV projection exposure apparatus. Such a mirror is shown schematically in the form of a mirror 70 in FIG. 5.

The mirror 70 has a reflective (HR) layer 72, a main body 74 and an NTE layer 76. The layer 70 can have further layers between the reflective layer 72 and the NTE layer 76 and between the NTE layer 76 and the main body 74. As will be described later, such a mirror, in addition to the NTE layer 76, can also be provided with an additional PTE layer as well. Moreover, the NTE layer 76 can also form the main body 74 itself or a part thereof.

If the mirror 70 is available in a mirror arrangement for an EUV projection exposure apparatus, then it is possible to set the surface profile of the surface 58 in accordance with FIG. 4b) proceeding from the surface profile of the surface 58 in FIG. 4a) without excessive heat input and without targeted local cooling as is shown in FIGS. 6a) and b).

FIG. 6a) shows that, as a result of heat being locally applied in a targeted manner to the mirror 50 in FIG. 3, the surface deformation 62 in accordance with FIG. 4b) is set in addition to the surface deformation 60 in accordance with FIG. 4a). Therefore, in contrast to the illustration shown in FIG. 4c), the surface deformation 60 is not overwritten by global heating of the mirror 50.

FIG. 6b) illustrates that a wave deformation 80 is introduced into a surface 78 of the reflective layer 72 of the mirror 70 by targeted local application to the mirror 70, more precisely the NTE layer 76, which wave deformation is positioned with regard to its optical effect at the level of the surface deformation 60 and is the inverse thereof, i.e. is a surface valley. If the two mirrors 70 and 50 are arranged in the beam path of the EUV radiation at positions at which they have similar or even identical optical effects on the wavefront of the EUV radiation, that is to say if the two mirrors 50 and 70 are arranged at positions which are optically conjugate with respect to one another as well as possible, this gives rise to a resulting optical effect on the wavefront of the EUV radiation which corresponds to that of the surface profile of the surface 58 in FIG. 4b). This surface profile, in which only the surface deformation 62 has a resulting optical effect on the wavefront of the EUV radiation, is shown in FIG. 6c).

In the case of the method described above, therefore, it is not necessary for the mirror 50 to be greatly heated overall in order to eliminate the surface deformation 60 in terms of its optical effect, rather it is possible to employ purely targeted local and thus lower heat inputs because the surface deformation 80 itself can be set by targeted local application of heat and cancels the surface deformation 60 in terms of its optical effect.

While the exemplary embodiment just described provides a mirror arrangement of which one mirror is provided with at least one NTE layer and at least one other mirror is provided with at least one PTE layer, the combination of NTE layer and PTE layer can also be realized in a single mirror, as will be described later.

FIG. 7 shows by way of example the desired profile of the resulting optical effect of a mirror arrangement on the wavefront of the EUV radiation in a projection exposure apparatus. The profile of the optical effect has three surface peaks 82, 84, 86 and two surface valleys 88 and 90, as seen in cross section. With a conventional mirror having only PTE layers, such an optical effect can be realized at most if the mirror could be locally cooled in a targeted manner, which, however, is associated with the technical problems mentioned in the introduction.

By contrast, the desired surface profile of the optical effect can easily be realized by a mirror arrangement comprising the mirrors 50 in accordance with FIGS. 3 and 70 in accordance with FIG. 5, as described below with reference to FIGS. 8a) to d).

FIG. 8a) shows the mirror 50 additionally with a heat source 92, which is embodied as an infrared (IR) radiation source. Such an IR radiation source can be formed by an IR pixel diode arrangement. Via the heat source 92, heat is locally applied to the PTE layer 56 in a targeted manner as is indicated by arrows 93a, 93b and 93c. In this case, the IR rays impinge on the reflective layer 52 and through the latter heat the actual PTE layer 56 at positions 95a, 95b and 95c at which an expansion of the PTE layer is desired for producing the surface peaks 82, 84 and 86. In order to produce the surface peaks 82, 84 and 86, as shown in FIG. 7, with different amplitudes, the absolute values of heat input at the positions 95, 95b and 95c correspondingly differ from one another. This is indicated by heat arrows 97a, 97b and 97c of different lengths in FIG. 8a). For this purpose, the heat source 92 can be designed in particular such that it can apply positionally variable heat distribution to the PTE layer.

As a result of the application of heat to the PTE layer 56 in accordance with FIG. 8a), a surface profile of the surface 58 as shown in FIG. 8b) is set. The surface profile accordingly has the surface peaks 82, 84 and 86.

It is also possible, instead of the separate layer 56 or additionally, to use the reflective layer 52 as a PTE layer.

FIG. 8c) shows the mirror 70, to which a further heat source 96 in the form of an IR radiation source 98 is assigned, in order to locally apply heat to the NTE layer 76 in a targeted manner. In this case, heat is applied to the NTE layer 76 from the side of the main body 74 or the rear side thereof, in particular through the main body 74, which for this purpose is produced from a material that is transmissive to IR radiation. A ULE glass ceramic body, in particular, can be used for this purpose as material for the main body 74. Moreover, the main body can be polished in a suitably transparent fashion.

The application of heat to the NTE layer 76 is illustrated here by arrows 99a and 99b, wherein the heat is radiated locally in a targeted manner at positions 101a and 101b corresponding to the desired positions of the surface valleys 88, 90 to be produced in FIG. 7. In order to produce the surface valleys 88, 90 with different amplitudes here as well, the heat from the heat source 96 is radiated at the positions 101a and 101b with different absolute values of heat, as is illustrated by heat arrows 103a and 103b of different lengths. Here, too, the heat source 96 is designed to apply positionally variable heat distribution to the NTE layer.

As a result of the application of heat to the NTE layer 76 at the positions 101a and 101b, the NTE layer accordingly contracts, as a result of which the surface valleys 88, 90 are produced, as is illustrated in FIG. 8d).

With a mirror arrangement comprising the mirrors 50 and 70 in accordance with FIGS. 8a) to d) a thermal manipulator is thus provided which makes it possible to set in the combination of the surface profiles of the surfaces 58 and 78 a resulting surface profile which produces a specific desired optical effect on the wavefront of the EUV radiation, as is shown in FIG. 7.

It should be pointed out at this juncture that instead of only one mirror 50 and only one mirror 70, two or three mirrors of the type of the mirror 50 and/or two mirrors of the type of the mirror 70 can be arranged in the beam path of the EUV radiation, the production of the surface peaks 82, 84, 86 then being distributed between the two or three mirrors of the type of the mirror 50, and/or the production of the surface valleys 88 and 90 then being distributed between the two mirrors of the type of the mirror 70. As a result, the heat inputs can be distributed along a plurality of mirrors, which further reduces the thermal loading of the individual mirrors and can increase the number of degrees of freedom for the manipulator.

In particular it is advantageous if the mirror arrangement of the EUV projection exposure apparatus comprises at least two mirrors each having at least one NTE layer.

Referring to FIGS. 9 and 10, a further exemplary embodiment of a mirror arrangement will be described, which mirror arrangement uses a mirror having at least one PTE layer and at least one NTE layer.

FIG. 9 firstly shows a desired profile 102 of the optical effect on the wavefront of EUV radiation with a surface peak 104 and a surface valley 106.

FIG. 10 shows a mirror 110 for an EUV projection exposure apparatus, which mirror can be used to set the profile 102 of the optical effect on the wavefront of the EUV radiation by itself. The mirror 110 has a reflective (HR) layer 112, a main body 114, a PTE layer 116, an NTE layer 118 and a thermally insulating (ISO) layer 120 between the PTE layer 116 and the NTE layer 118. In this case, the PTE layer 116 can also be part of the HR layer 112.

A heat source 122, embodied as an IR radiation source 124, and also a further heat source 126, likewise embodied as an IR radiation source 128, are assigned to the mirror 110.

Via the heat source 124, heat is locally applied to the PTE layer 116 in a targeted manner, to be precise at a position 130 situated at the level of a position 132 of a surface 134 of the reflective layer 112. As a result of application of heat to the PTE layer at the position 130 with heat transfer through the reflective layer 112, as is indicated by a heat arrow 136, the PTE layer expands in the region of the position 130, and a surface deformation in the form of the surface peak 104 correspondingly forms on the surface 134 of the reflective layer 112. The heat input at the position 130 should be dimensioned taking account of any possible additional thermally governed expansion of the reflective layer 112, since, specifically, heat is applied to the PTE layer 116 here through the reflective layer 112.

Heat is likewise applied to the NTE layer 118, to be precise via the heat source 126 through the main body 114 at a position 138 situated at the level of a position 140 of the surface 134 of the reflective layer 112 at which the wave valley 106 is intended to be produced. The heat input into the NTE layer 118 is indicated by a heat arrow 142. As a result of the application of heat to the NTE layer at the position 138, the NTE layer contracts in the region of the position 138, wherein the deformation of the NTE layer that is caused as a result propagates through the thermally insulating layer 120, the PTE layer 116 and the reflective layer 112, such that the surface valley 106 arises at the surface 134 of the reflective layer 112.

The thermally insulating layer 120 prevents or reduces a heat transfer between the PTE layer 116 and the NTE layer 118, such that the application of heat to the PTE layer 116 at the position 130 does not also lead to an application of heat to the NTE layer 118, and vice versa.

By virtue of the construction of the mirror 110 both with a PTE layer and with an NTE layer and as a result of targeted local application of heat to the NTE layer independently of the PTE layer, a surface profile of the surface 134 with surface peaks and surface valleys can thus be set with only one mirror.

FIG. 11 shows an example of a layer construction of a mirror 150 in accordance with the principles of the present invention.

The mirror 150 has a reflective (HR) layer 152, a main body 154 and an NTE layer 156 between the reflective layer 152 and the main body 154. A thermally insulating (ISO) layer 158 is optionally situated between the reflective layer 152 and the NTE layer 156, the thermally insulating layer preferably having no or only a very low coefficient of thermal expansion. Furthermore, the mirror 150 optionally has a thermally insulating (ISO) layer 160 on that side of the NTE layer 156 which faces away from the reflective layer 152, the thermally insulating layer preferably comprising a material having no or only a very low coefficient of thermal expansion. The material for the insulating layer 160 can be produced from quartz, for example. A layer 162 having high thermal conductivity (HC) is optionally situated between the NTE layer 156 and the main body 154 and serves for introducing the residual heat that remained in the mirror 150 into the main body 154 as uniformly as possible. In this case, the thickness and the material of the layer 162 should be adapted to the thickness and material of the NTE layer 156. The HC layer 162 ideally has a low coefficient of thermal expansion. The insulating (ISO) layers, in particular the ISO layer 160 is preferably embodied in a transparent fashion in order to enable the IR rays to penetrate in particular into the NTE layer 156. The HC layer having high thermal conductivity 162 is likewise preferably embodied in a transparent fashion in order to enable the IR rays to penetrate into the ISO layer 160.

The main body 154 preferably consists of ULE ceramic. The reflective layer 152 can be a molybdenum-silicon layer stack. The layer 162 having high thermal conductivity can be produced for example from copper or nickel or, in the case of a preferred transparency mentioned above, from $CaF_2$.

Table 1 below lists various materials having a negative coefficient of thermal expansion which can be used as material for the NTE layer 156. In Table 1, CTE denotes the coefficient of thermal expansion, K denotes the unit Kelvin, d denotes an exemplary thickness of the NTE layer, delta t denotes an assumed temperature difference, and delta d denotes the contraction of the NTE layer given the assumed temperature difference delta t. $\delta$ and $\beta$ in the formula $n=(1-\delta)+i\beta$ denote the real $\delta$ deviating from 1 and the imaginary part $\beta$ of the complex refractive index n of the respective material at a wavelength of 13.5 nm. These variables indicate the extent to which the respective material can be used within or even above the HR layer. The lower the value $\beta$, the less transmission is lost through the NTE layer within or above the HR layer. The respective suitability of the material is determined by the efficiency ratio $CTE/\beta$. The more negative the ratio, the more efficient the use of the respective material.

TABLE 1

| | CTE [10e-6/K] | $\delta$ | $\beta$ | CTE/$\beta$ | d [nm] | delta t [K] | delta d [nm] |
|---|---|---|---|---|---|---|---|
| $PbTiO_3$ | -3.300 | 0.097 | 0.054 | -60.584 | 1000.000 | 10.000 | -0.033 |
| $Sc_2W_3O_{12}$ | -2.200 | 0.022 | 0.010 | -216.599 | 1000.000 | 10.000 | -0.022 |
| $Y_2W_3O_{12}$ | -4.200 | 0.031 | 0.013 | -325.677 | 1000.000 | 10.000 | -0.042 |
| $Lu_2W_3O_{12}$ | -6.800 | 0.059 | 0.032 | -213.688 | 1000.000 | 10.000 | -0.068 |

TABLE 1-continued

|  | CTE [10e-6/K] | δ | β | CTE/β | d [nm] | delta t [K] | delta d [nm] |
|---|---|---|---|---|---|---|---|
| NbOPO$_4$ | −3.700 | 0.099 | 0.032 | −114.294 | 1000.000 | 10.000 | −0.037 |
| ZrV$_2$O$_7$ | −7.100 | 0.076 | 0.030 | −233.806 | 1000.000 | 10.000 | −0.071 |
| ZrW$_2$O$_8$ | −8.700 | 0.047 | 0.020 | −443.595 | 1000.000 | 10.000 | −0.087 |
| ZrMo$_2$O$_8$ | −5.000 | 0.069 | 0.020 | −250.279 | 1000.000 | 10.000 | −0.050 |
| K$_5$Zr(PO$_4$)$_3$ | −0.500 | 0.010 | 0.003 | −144.829 | 1000.000 | 10.000 | −0.005 |
| KZr$_2$(PO$_4$)$_3$ | −1.700 | 0.009 | 0.003 | −515.072 | 1000.000 | 10.000 | −0.017 |
| Zn(CN)$_2$ | −18.1000 | 0.072 | 0.045 | −402.059 | 1000.000 | 10.000 | −0.181 |

In selecting the materials for the at least one NTE layer, the following criteria should be taken into consideration:
  a precise knowledge of the coefficient of expansion in the temperature range used
  the isotropy of the material (otherwise stresses and the risk of microcracks arise)
  production as simply as possible including application during the production of the mirror
  negative coefficient of thermal expansion that is as high as possible
  no phase transitions at relatively low pressures
  isotropic or anisotropic contraction of the material used.

Example of a Compensation of the HR Layer by an NTE Layer

The material ZrW$_2$O$_8$ is used for the NTE layer. The reflective layer shall be a molybdenum-silicon layer stack comprising 50 layers of a layer system composed of 2.4 nm molybdenum and 3.3 nm Si, this layer stack often being mentioned in the literature. A total thickness of 120 nm molybdenum and 165 nm silicon thus arises for the reflective layer. The average coefficient of thermal expansion of the reflective layer is 3.61×10$^{-6}$/K, determined from the coefficient of thermal expansion of molybdenum of approximately 5×10$^{-6}$/K and of silicon of approximately 2.6×10$^{-6}$/K. A thermal expansion of the reflective layer can be compensated for with an approximately 118 nm thick NTE layer composed of ZrW$_2$O$_8$. Given a layer thickness of the NTE layer composed of ZrW$_2$O$_8$ of more than 118 nm thickness, therefore, even with the same heat input into both layers, the contraction of the NTE layer can be greater than the thermal expansion of the reflective layer, in order thus, for example, to produce a surface valley in the surface of the reflective layer, or in order to compensate for further expansion effects of the material ULE.

FIG. 12 shows a further exemplary embodiment of a mirror 170 in accordance with the principles of the present invention.

The mirror 170 has a reflective (HR) layer 172, a main body 174, a PTE layer 176, and an NTE layer 178 between the reflective layer 172 and the main body 174. The PTE layer 176 and the NTE layer 178 can also be interchanged. The construction of the reflective layer 172, the NTE layer 178 and the main body 174 can be as in the case of the mirror 150 in FIG. 11.

The PTE layer 176 is, for example, a so-called surface protection layer, such as is usually used in the case of EUV mirrors.

A thermally insulating layer 180 is situated between the PTE layer 176 and the NTE layer 178, the task of which thermally insulating layer is to minimize a heat transfer between the PTE layer 176 and the NTE layer 178, particularly if, as has already been described above, heat is applied to the PTE layer 176 and the NTE layer 178 from opposite sides of the mirror 170. By way of example, quartz can be used as material for the layer 180.

A thermally insulating layer 182 and a layer 184 having a high thermal conductivity are situated between the NTE layer 178 and the main body 174, as has already been described with reference to the mirror 150 in FIG. 11.

Finally, a capping layer (CAP) 186 is also applied on the reflective layer 172, and protects the reflective layer 172 toward the environment.

FIG. 13 shows an EUV projection exposure apparatus for microlithography in which the principles of the present invention can be applied, the apparatus being provided with the general reference sign 200. The EUV projection exposure apparatus comprises an illumination system 202 and a projection lens 204. The illumination system 202 has an EUV radiation source 206, a mirror arrangement comprising a collector mirror 208, and further mirrors 210, 212, 214, 216 and 218. The EUV radiation generated by the EUV radiation source 206 is directed via the collector mirror 208, the mirrors 210, 212, 214, 216 and 218 into an object plane 220 in which a reticle 222 is arranged.

The object plane 220 forms the object plane of the projection lens 204, which has in the direction of propagation of the EUV radiation a mirror arrangement comprising a mirror 224, a mirror 226, a mirror 228, a mirror 230, a mirror 232 and a mirror 234. The mirrors 224 and 234 image a pattern (not illustrated here) of the reticle 222 into an image plane 236, in which a wafer 238 is arranged.

The mirror arrangement of the projection lens 204 formed from the mirrors 224 to 234 can comprise, then, according to the principles of the present invention, at least one mirror having at least one NTE layer and/or at least one mirror having at least one NTE layer and at least one PTE layer. In particular the two mirrors 224 and 226 are suitable here for such a configuration of the mirrors 224 to 234 of the mirror arrangement of the projection lens 204. Thus, the mirror 224 can have at least one PTE layer, as in the case for example of the mirror 50 in FIG. 3 or of the mirror 110 in FIG. 10 or else of the mirror 170 in FIG. 12. The mirror 226 can have at least one NTE layer, such as, for example, the mirror 30 in FIG. 2, the mirror 70 in FIG. 5, the mirror 110 in FIG. 10, and the mirror 150 in FIG. 11 or the mirror 170 in FIG. 12.

The two mirrors 224 and 226 are suitable here as a PTE and NTE mirror pair in particular because the two mirrors 224 and 226 are arranged in the projection lens 204 at positions at which they have a similar optical effect on the wavefront of the EUV radiation. Specifically, both mirrors 224 and 226 are arranged near a pupil plane situated between the two mirrors 224 and 226.

The mirrors 224 and 226 are assigned corresponding heat sources for locally applying heat in a targeted manner to the at least one PTE layer of the mirror 224 and the at least one NTE layer of the mirror 226, the heat sources not being illustrated in FIG. 13, but in this regard reference is made to FIGS. 8a) and c) and FIG. 10.

Consequently, with the mirror pair comprising the mirrors 224 and 226, a thermal manipulator is provided with which the surface profile of the respective mirror is set by targeted local application to the at least one PTE layer of the mirror 224 and/or the at least one NTE layer of the mirror 226 in such a way that a resulting surface profile of the mirror arrangement comprising both mirrors 224 and 226 arises in a combination of both surface profiles, in order to set the wavefront profile of the EUV radiation reflected at the mirrors 224 to 234 in a desired manner. This setting can be performed in order to compensate for an imaging aberration, in order to counteract a deformation of the surface that is caused by the EUV radiation and/or in order to vary the wavefront in a manner dependent on an operating mode of the projection exposure apparatus 200.

A further mirror pair suitable for a thermal manipulator in this sense constitutes the mirrors 232 and 234.

It was described with reference to FIG. 13 that the projection lens 204 according to the principles of the present invention can comprise at least one mirror having at least one NTE layer, and/or at least one mirror having at least one NTE layer and at least one PTE layer.

It was furthermore described above that it is possible to influence the wavefront of the EUV radiation via targeted local application of heat to such mirrors, e.g. the mirrors 224 and 226 of the projection lens 204 in FIG. 13.

FIG. 14 then shows a basic illustration of a control system 300 which is able to drive the thermal manipulators in a suitable manner in order to obtain a desired wavefront profile of the EUV radiation.

FIG. 14 shows a projection lens 302, which can be e.g. the projection lens 204 from FIG. 13. The projection lens 302 images, via EUV radiation 304, a reticle (not illustrated), arranged in a reticle plane 306 onto a wafer (not illustrated), arranged in a wafer plane 308.

The projection lens 302 here comprises by way of example two heat sources 310 and 312, which, as described above, can be embodied in particular as infrared radiation sources, in particular as IR pixel diode arrangements. The heat sources 310 and 312 are able to locally apply heat, in particular a heat intensity profile, in a targeted manner to individual mirrors, not illustrated in FIG. 14, of the projection lens 302, as has already been described above. The mirrors can be e.g. the mirrors 224 and 226 of the projection lens 204 in FIG. 13.

A wavefront measuring device 314 serves for measuring the wavefronts of the projection lens 302 in the wafer plane 308. The wavefronts can be measured before and/or during the operation of the projection lens 302.

The wavefront measuring device 314 is connected to a calculating and wavefront measuring control unit 316 with pulse transmitter, which control unit initiates the measurements of the wavefronts by the wavefront measuring device 314 and then performs the evaluation and conditioning of the wavefronts. Instead of initiating a measurement of wavefronts, wavefronts can also be generated by the calculating and wavefront measuring control unit 316 on the basis of extrapolation or prediction models.

The control system 300 furthermore comprises a computing unit 318 and a memory 320.

The memory 320 stores the optical sensitivities of the mirrors that are variable by targeted local application of heat (e.g. the mirrors 224 and 226 of the projection lens 204 in FIG. 13). It is assumed here that the heat sources 310 and 312 respectively provide different heat application configurations, e.g. in the case where the heat sources 310, 312 are embodied as IR pixel diode arrays. Different heat intensity profiles are provided in this case. Furthermore, the optical effect is determined for so-called basic configurations representing specific basic patterns of driving for the IR pixel arrays.

The computing unit 318 serves for computing a wavefront correction that determines, for a wavefront to be corrected that is provided via the calculating and wavefront measuring control unit 316, with the aid of the optical sensitivities stored in the memory 320, a correction in the form of actuation paths for the basic configurations mentioned above. The computing unit 318 determines from the basic configurations, by superposition, intensity profiles for the application of heat to the mirrors (e.g. the mirrors 224 and 226 of the projection lens 204 in FIG. 13), such that the mirrors to which heat is applied in a positionally dependent manner in this way alter the wavefronts of the projection lens 302 in a computed manner.

The actuation paths determined by the computing unit 318 for the basic configurations are communicated by the computing unit 318 to corresponding control units 322, 324 assigned to the heat sources 310 and 312, respectively, wherein the control units 322 and 324 translate the above-mentioned actuation paths of the basic configurations into actuating commands for the heat sources 310 and 312, respectively, which then locally apply heat, preferably with a corresponding heat intensity profile, in a targeted manner to the mirrors (not illustrated) to which heat is to be applied.

The invention claimed is:

1. An arrangement, comprising:
a plurality of mirrors comprising a first mirror, each of the plurality of mirrors comprising:
a surface that is reflective in the EUV spectral range; and
a main body; and
a first heat source,
wherein:
the first mirror further comprises a layer comprising a material having a negative coefficient of thermal expansion;
the first heat source is configured to apply heat to the layer comprising the material having the negative coefficient of thermal expansion; and
the first heat source is configured to apply a positionally variable heat distribution to the layer comprising the material having the negative coefficient of thermal expansion.

2. The arrangement of claim 1, wherein:
the first mirror further comprises:
a thermally insulating layer; and
a layer comprising a material having a positive coefficient of thermal expansion; and
the thermally insulating layer separates the layer comprising the material having the positive coefficient of thermal expansion from the layer comprising the material having the negative coefficient of thermal expansion.

3. The arrangement of claim 2, wherein the material having the positive coefficient of thermal expansion comprises at least one material selected from the group consisting of Zr, Y, Nb, Mo, Si, Ge, Ru, RuO2, RuSi, Ni.

4. The arrangement of claim 2, further comprising a second heat source, wherein the second heat source is configured to apply heat to the layer comprising the material having the positive coefficient of thermal expansion.

5. The arrangement of claim 1, wherein the plurality of mirrors comprises a second mirror which is different from the first mirror, and the second mirror comprises a layer comprising a material having a negative coefficient of thermal expansion.

6. The arrangement of claim 5, wherein:
during use of the arrangement, EUV radiation passes through the arrangement along a path; and
the first and second mirrors are arranged at positions in the path that are conjugate or approximately conjugate with regard to their optical effect.

7. The arrangement of claim 5, further comprising a second heat source, wherein the second heat source is configured to apply heat to a layer of the second mirror.

8. The arrangement of claim 1, wherein the plurality of mirrors comprises a second mirror which is different from the first mirror, and the second mirror comprises a layer comprising a material having a positive coefficient of thermal expansion.

9. The arrangement of claim 1, wherein the first heat source is configured to apply heat to the layer comprising the material having the negative coefficient of thermal expansion from a side of the main body of the first mirror.

10. An arrangement, comprising:
a plurality of mirrors comprising a first mirror, each of the plurality of mirrors comprising:
a surface that is reflective in the EUV spectral range; and
a main body; and
a first heat source,
wherein:
the first mirror further comprises a layer comprising a material having a negative coefficient of thermal expansion;
the first heat source is configured to apply heat to the layer comprising the material having the negative coefficient of thermal expansion; and
the first heat source comprises an IR radiation source.

11. An arrangement, comprising:
a plurality of mirrors comprising a first mirror, each of the plurality of mirrors comprising:
a surface that is reflective in the EUV spectral range; and
a main body; and
a first heat source,
wherein:
the first mirror further comprises a layer comprising a material having a negative coefficient of thermal expansion;
the first heat source is configured to apply heat to the layer comprising the material having the negative coefficient of thermal expansion; and
the first heat source is configured to apply heat to the layer comprising the material having the negative coefficient of thermal expansion through the reflective layer of the first mirror.

12. The arrangement of claim 11, wherein the first mirror further comprises a thermally insulating layer which is between the main body of the first mirror and the layer comprising the material having the negative coefficient of thermal expansion.

13. The arrangement of claim 12, wherein the first mirror further comprises a layer having high thermal conductivity which is between the thermally insulating layer and the main body of the first mirror.

14. An arrangement, comprising:
a plurality of mirrors comprising a first mirror, each of the plurality of mirrors comprising:
a surface that is reflective in the EUV spectral range; and
a main body; and
a first heat source,
wherein:
the first mirror further comprises a layer comprising a material having a negative coefficient of thermal expansion;
the first heat source is configured to apply heat to the layer comprising the material having the negative coefficient of thermal expansion; and
the material having the negative coefficient of expansion comprises at least one material selected from the group consisting of $ZrMo_2O_8$, $ZrW_2O_8$, $HfMo_2O_8$, $Zr_2(MoO_4)_3$, $Zr_2(WO_4)_3$, $Hf_2(MoO_4)_3$, $ScF_3$, $ZnC_2N_2$, $ZnF_2$, $Y_2W_2O_{12}$, $BiNiO_3$.

* * * * *

UNITED STATES PATENT AND TRADEMARK OFFICE
CERTIFICATE OF CORRECTION

PATENT NO. : 9,709,770 B2
APPLICATION NO. : 14/584164
DATED : July 18, 2017
INVENTOR(S) : Boris Bittner et al.

It is certified that error appears in the above-identified patent and that said Letters Patent is hereby corrected as shown below:

In the Claims

Column 22, Line 43, Claim 14, delete "$Zr_2\ (MoO_4)_3$," and insert -- $Zr_2(MoO_4)_3$,--.

Column 22, Line 43, Claim 14, delete "$Hf_2\ (MoO_4)_3$," and insert -- $Hf_2(MoO_4)_3$, --.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*